(12) United States Patent
Chiang

(10) Patent No.: US 9,570,630 B2
(45) Date of Patent: Feb. 14, 2017

(54) SCHOTTKY DIODE STRUCTURE

(71) Applicant: MediaTek Inc., Hsin-Chu (TW)

(72) Inventor: Puo-Yu Chiang, Su'ao Township, Yilan County (TW)

(73) Assignee: MEDIATEK INC., Hsin-Chu (TW)

( * ) Notice: Subject to any disclaimer, the term of this patent is extended or adjusted under 35 U.S.C. 154(b) by 93 days.

(21) Appl. No.: 13/927,468

(22) Filed: Jun. 26, 2013

(65) Prior Publication Data

US 2015/0001666 A1    Jan. 1, 2015

(51) Int. Cl.
*H01L 29/872* (2006.01)
*H01L 29/739* (2006.01)

(52) U.S. Cl.
CPC ......... *H01L 29/872* (2013.01); *H01L 29/7391* (2013.01)

(58) Field of Classification Search
CPC ............. H01L 29/872; H01L 29/66143; H01L 29/7931
USPC .................................. 257/471, E29.338, 484
See application file for complete search history.

(56) References Cited

U.S. PATENT DOCUMENTS

| | | | |
|---|---|---|---|
| 7,943,472 B2 * | 5/2011 | Pendharkar et al. | 438/379 |
| 8,513,764 B2 * | 8/2013 | Stribley et al. | 257/484 |
| 2008/0169475 A1 | 7/2008 | Nishio et al. | |
| 2009/0020826 A1 * | 1/2009 | Huang et al. | 257/371 |
| 2012/0211859 A1 | 8/2012 | Stribley et al. | |

FOREIGN PATENT DOCUMENTS

CN          101136441          3/2008

* cited by examiner

*Primary Examiner* — Marcos D Pizarro
(74) *Attorney, Agent, or Firm* — McClure, Qualey & Rodack, LLP

(57) ABSTRACT

The invention provides a Schottky diode structure. An exemplary embodiment of a Schottky diode structure includes a semiconductor substrate having an active region. A first well region having a first conductive type is formed in the active region. A first doped region having the first conductive type is formed on the first well region. A first electrode is disposed on the active region, covering the first doped region. A second electrode is disposed on the active region, contacting to the first well region. A gate structure is disposed on the first well region. A second doped region, having a second conductive type opposite to the first conductive type, and is formed on the first well region. The gate structure and the second doped region are disposed between the first and second electrodes.

30 Claims, 4 Drawing Sheets

SCHOTTKY DIODE STRUCTURE

BACKGROUND OF THE INVENTION

Field of the Invention

The present invention relates to a Schottky diode structure, and in particular, to a Schottky diode structure with low leakage in a reverse bias.

Description of the Related Art

Because of the advantages of having a majority of conduction carriers and a low turn-on voltage in a forward bias, Schottky barrier diodes (SBDs) are widely utilized to improve power transfer efficiency in power management integrated circuits (ICs). However, SBDs having low turn-on voltage also indicates that the SBDs have high leakage current in a reverse bias. When SBDs are used in devices, the high leakage current problem during reverse bias conditions gets even worse, due to the Schottky barrier lowering effect.

Thus, a novel Schottky diode structure to reduce reverse leakage and maintain the advantage of a low forward voltage is desirable.

BRIEF SUMMARY OF INVENTION

A Schottky diode structure is provided. An exemplary embodiment of a Schottky diode structure comprises a semiconductor substrate having an active region. A first well region having a first conductive type is formed in the active region. A first doped region having the first conductive type is formed on the first well region. A first electrode is disposed on the active region, covering the first doped region. A second electrode is disposed on the active region, contacting to the first well region. A gate structure is disposed on the first well region. A second doped region, having a second conductive type opposite to the first conductive type, and is formed on the first well region. The gate structure and the second doped region are disposed between the first and second electrodes.

Another exemplary embodiment of a Schottky diode structure comprises a semiconductor substrate having an active region. A first well region having a first conductive type is formed in the active region. A first doped region having the first conductive type is formed on the first well region. A first electrode is disposed on the active region, covering the first doped region. A second electrode is disposed on the active region, contacting to the first well region. A second doped region, having a second conductive type opposite to the first conductive type, and is formed on the first well region. A gate structure covers the second doped region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
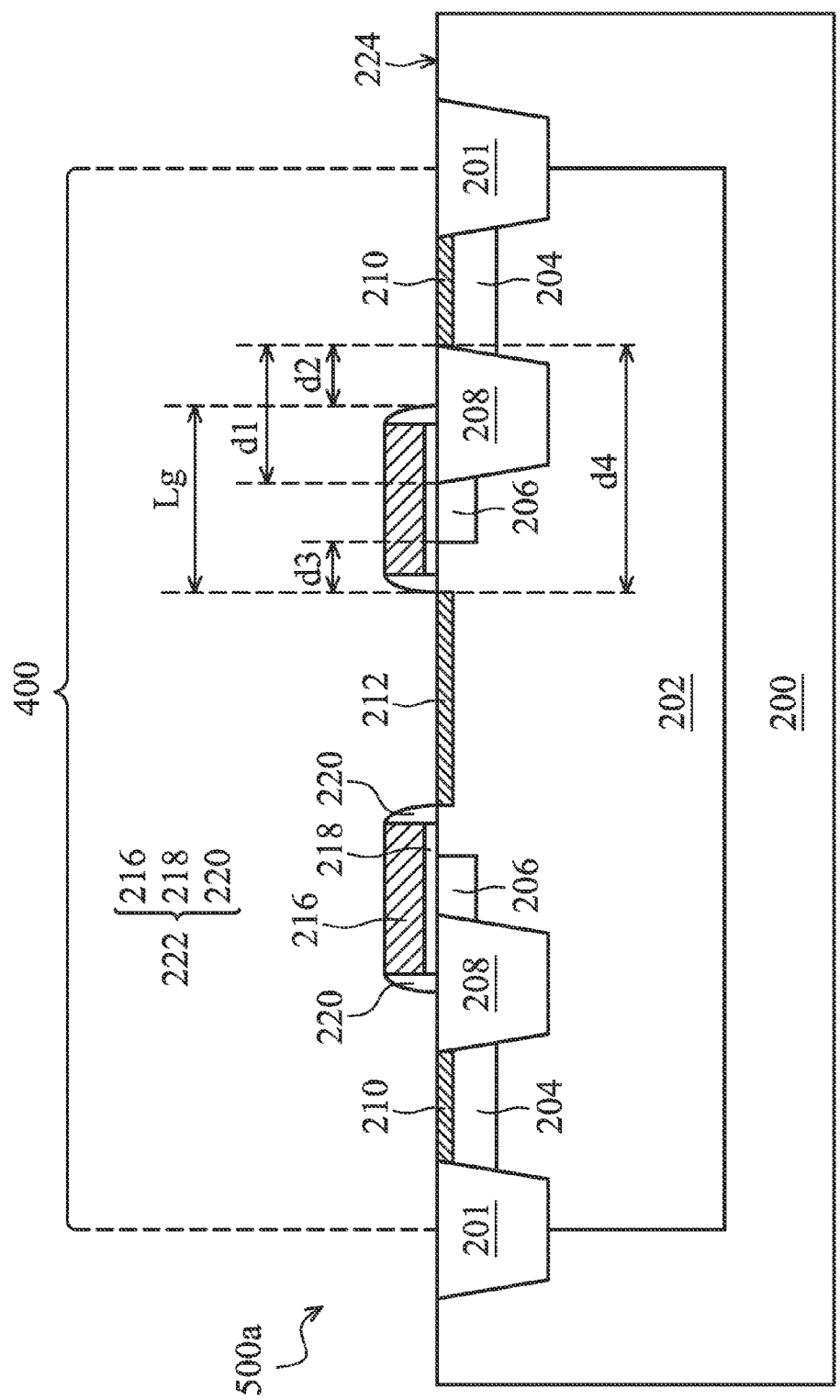
FIG. 1A is a cross section of one exemplary embodiment of a Schottky diode structure of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1A is a cross section of one exemplary embodiment of a Schottky diode structure 500a of the invention. As shown in FIG. 1A, one exemplary embodiment of a Schottky diode structure 500a comprises a semiconductor substrate 200 having an active region 400 defined by isolation regions 201 such as shallow trench isolation (STI) features. The semiconductor substrate 200 may comprise silicon. In alternative embodiments, SiGe, bulk semiconductor, strained semiconductor, compound semiconductor, silicon on insulator (SOI), and other commonly used semiconductor substrates can be used for the semiconductor substrate 200. The semiconductor substrate 200 may have a desired conductive type by implanting p-type or n-type impurities. A first well region 202 having a first conductive type is formed in the active region 400. A first doped region 204 having the first conductive type is formed on the first well region 202. In one embodiment, a dopant concentration of the first doped region 204 is greater than that of that of the first well region 202. For example, if the first well region 202 serves as an n-type well region, the first doped region 204 would serve as an n-type heavily (n+) doped region. Alternatively, if the first well region 202 serves as a p-type well region, the first doped region 204 would serve as a p-type heavily (p+) doped region. In this embodiment, the first well region 202 serves as an n-type well region 202, and the first doped region 204 serves as an n-type heavily (n+) doped region 204. The Schottky diode structure 500a further comprises at least two electrodes for the anode and cathode electrodes of a Schottky diode structure. As shown in FIG. 1A, a first electrode 210 is disposed in the active region 400, adjacent to the surface 224 of the semiconductor substrate 200. Also, the first electrode 210 is disposed covering the first doped region 204. A second electrode 212 is disposed in the active region 400, adjacent to the surface 224 of the semiconductor substrate 200. In one embodiment, the first electrode 210 and the second electrode 212 are laterally separated from each other by a distance d4. Also, the second electrode 212 contacts to the first well region 202 without using any heavily (n+ or p+) doped regions. In this embodiment, the first electrode 210 serves as a cathode and the second electrode 212 serves as an anode. In one embodiment, the first electrode 210 and the second electrode 212 may comprise silicide patterns.

As shown in FIG. 1A, the Schottky diode structure 500a further comprises a second doped region 206, having a second conductive type opposite to the first conductive type, and is formed on the first well region 202. For example, if the first doped region 204 serves as an n-type heavily (n+)

doped region, the second doped region 206 may serve as a p-type heavily (p+) region. If the first doped region 204 serves as a p-type heavily (p+) doped region, the second doped region 206 may serve as an n-type heavily (n+) region. In this embodiment, the second doped region 206 serves as a p-type heavily (p+) doped region 206.

Another isolation region 208, such as a shallow trench isolation (STI) feature, is disposed in the first well region 202, having opposite sides respectively adjacent to the first doped region 204 and the second doped region 206. Therefore, the first doped region 204 and the second doped region 206 are laterally separated from each other by a distance d1. The distance d1 is also the same as a width of the isolation region 208 with d1. Also, a gate structure 222 is disposed on the first well region 202, laterally between the first electrode 210 and the second electrode 212. As shown in FIG. 1A, the gate structure 222 fully covers the second doped region 206. That is to say, the second doped region 206 is disposed within a boundary of the gate structure 222. Therefore, the second electrode 212 is separated from the second doped region 206 by a third distance d3 less than that of a length Lg of the gate structure 222. Also, the gate structure 222 partially covers the isolation region 208. Therefore, the gate structure 222 has two opposite sides, and one side is adjacent to the second electrode 212, and another side is separated from the first doped region 204/first electrode 210 by a distance d2 which is less than that of the distance d1. As shown in FIG. 1A, the distances d1, d2 and d3 are less than that of the distance d4. The gate structure 222 comprises a gate insulating layer 218, a poly pattern 216 disposed on the gate insulating layer 218, and a plurality of insulating spacers 220 is disposed on sidewalls of the poly pattern 216. In one embodiment, the gate structure 222 and the second doped region 206 are disposed surrounding the second electrode 212. That is to say, the gate structure 222 and the second doped region 206 are ring shaped, from a top view (not shown).

Figure 1B:
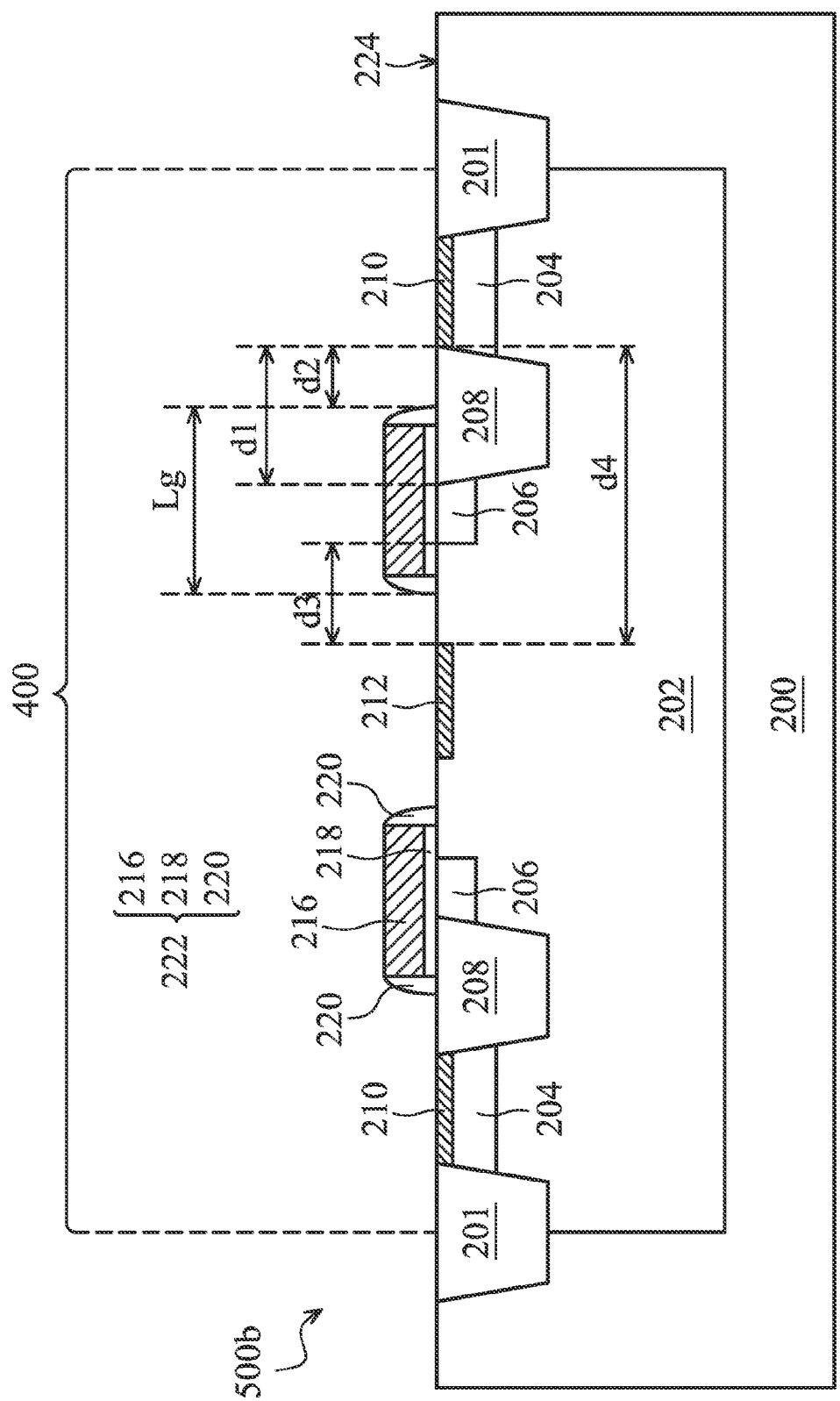
FIG. 1B is a cross section of another exemplary embodiment of a Schottky diode structure of the invention.

FIG. 1B is a cross section of another exemplary embodiment of a Schottky diode structure 500b of the invention. Alternatively, the second electrode 212 may have a distance apart from the insulating spacer 220 of the gate structure 222, which is close to the second electrode 212. Therefore, the second electrode 212 of the Schottky diode structure 500b need not to be directly contact with the gate structure 222 close thereto. Also, the second electrode 212 may be separated from the second doped region 206 by a third distance d3 less or larger than that of a length Lg of the gate structure 222 according to the design.

Figure 2A:
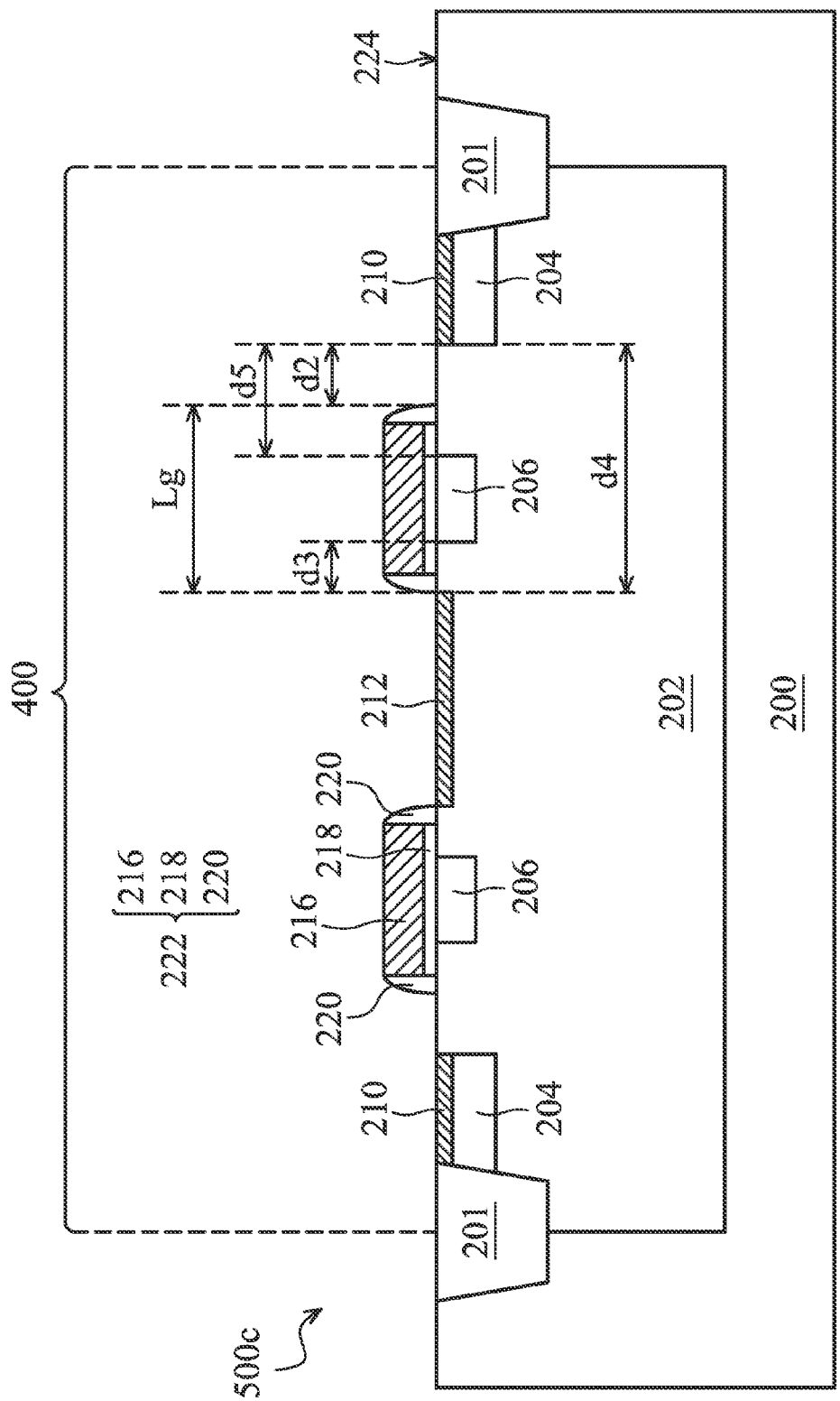
FIG. 2A is a cross section of yet another exemplary embodiment of a Schottky diode structure of the invention.

FIG. 2A is a cross section of yet another exemplary embodiment of a Schottky diode structure 500c of the invention. The differences between the Schottky diode structures 500a and 500c is that the first doped region 204 and the second doped region 206 of the Schottky diode structure 500c are separated from each other by a distance d5, which is equal to or greater than that of a minimum distance between an n-type heavily (n+) doped region and p-type heavily (p+) doped region in an n-well region of a semiconductor device design rule, without using an isolation region (such as the isolation region 208 as shown in FIGS. 1A and 1B). Therefore, the Schottky diode structure 500c may have a lower forward resistance than the Schottky diode structures 500a.

Figure 2B:
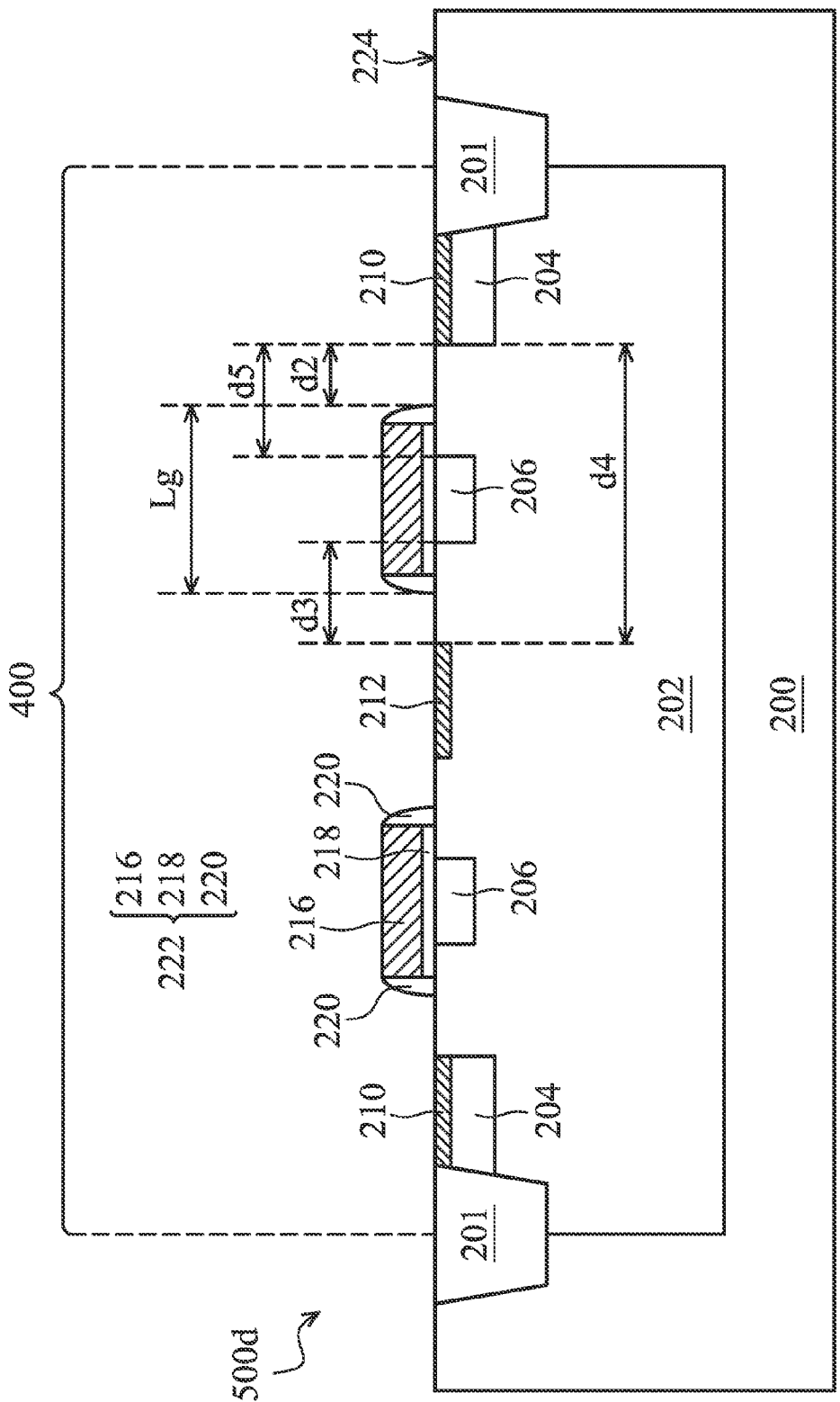
FIG. 2B is a cross section of still yet another exemplary embodiment of a Schottky diode structure of the invention.

FIG. 2B is a cross section of still yet another exemplary embodiment of a Schottky diode structure 500d of the invention. Alternatively, the second electrode 212 may have a distance apart from the insulating spacer 220 of the gate structure 222, which is close to the second electrode 212. Therefore, the second electrode 212 of the Schottky diode structure 500d need not to be directly contact with the gate structure 222 close thereto. Also, the second electrode 212 may be separated from the second doped region 206 by a third distance d3 less or larger than that of a length Lg of the gate structure 222 according to the design.

Embodiments provide a Schottky diode structure 500a, 500b, 500c or 500d. In one embodiment, the first electrode 210 (cathode) and the second electrode 212 (anode) of the Schottky diode structure 500a, 500b, 500c or 500d are laterally separated from each other by at least a gate structure 222, a second doped region 206 and an isolation region 208. The Schottky diode structure 500a, 500b, 500c or 500d uses the gate structure 222 to reduce a surface electric field of the second electrode 212 (anode). The gate structure 222 may generate a lateral electric field to the first well 202. In one embodiment, the gate structure 222 may be electrically floating, coupled to the second electrode 212 (anode), or coupled to other voltage, to enhance the capability of reducing the surface electric field of the second electrode 212 (anode). Also, the second doped region 206 (p+ doped region) disposed under the gate structure 222 may also generate a lateral electric field to the first well 202 due to a p-n junction between the second doped region 206 and the first well 202. Therefore, the second doped region 206 (p+ doped region) may help to further reduce the surface electric field of the second electrode 212 (anode). Further, the second doped region 206 is disposed laterally separated from the second electrode 212 with the distance d3 by using the gate structure 222. The second doped region 206. The Schottky diode structure 500a, 500b, 500c or 500d with the gate structure 222 may prevent the second doped region 206 from being placing under the second electrode 212 (anode) to generate a parasitic p-n diode, which is composed by the second doped region 206 and the first well 202. Therefore, the disadvantages due to the parasitic p-n diode, for example, a slow operating speed and a recovery problem by operating the Schottky diode from the forward bias to reverse bias, are eliminated. Therefore, the Schottky diode structure 500a, 500b, 500c or 500d is a pure Schottky diode without the parasitic p-n diode. When the Schottky diode structure 500a, 500b, 500c or 500d is reverse biased, the leakage current can be suppressed by the gate structure 222 and the second doped region 206, which can reduce surface electric field of the second electrode 212 (anode). Also, the Schottky diode structure 500a, 500b, 500c or 500d may maintain the advantage of a low forward voltage. Moreover, the Schottky diode structure 500a, 500b, 500c or 500d can be easy implemented by any suitable fabrication processes without additional photolithography and implant processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A Schottky diode structure, comprising:
a semiconductor substrate having an active region;
a first well region having a first conductive type formed in the active region;
a first doped region having the first conductive type formed on the first well region;

first electrodes disposed on the active region, covering and contacting the first doped region;
a second electrode centrally disposed on the active region, contacting to the first well region;
gate structures disposed on opposing lateral sides of the second electrode, wherein the second electrode, which is an anode of the Schottky diode, is separated from the gate structures; and
a second doped region, having a second conductive type opposite to the first conductive type, formed on the first well region, wherein the gate structure and the second doped region are disposed between the first and second electrodes,
wherein the first electrodes are disposed outside the gate structures, each at a distance further from the second electrode than the gate structures.

2. A Schottky diode structure, comprising:
a semiconductor substrate having an active region;
a first well region having a first conductive type formed in the active region;
a first doped region having the first conductive type formed on the first well region;
a first electrode disposed on the active region, covering and contacting the first doped region;
a second electrode disposed on the active region, contacting to the first well region;
a second doped region, having a second conductive type opposite to the first conductive type, formed on the first well region; and
a gate structure comprising a gate insulating layer, a poly pattern disposed directly on top of the gate insulating layer and substantially aligning vertically therewith, and a plurality of spacers disposed on aligned sidewalls of both the gate insulating layer and the poly pattern, the gate structure being covering the second doped region, wherein the second electrode, which is an anode of the Schottky diode, is separated from the gate structure,
wherein the first doped region is separated from the second doped region by a first distance, and wherein the gate structure is separated from the first electrode by a second distance less than that of the first distance.

3. The Schottky diode structure as claimed in claim 2, wherein the gate structure is electrically floating or coupled to the second electrode.

4. The Schottky diode structure as claimed in claim 2, wherein the first doped region is separated from the second doped region by a first distance.

5. The Schottky diode structure as claimed in claim 4, wherein the gate structure is separated from the first electrode by a second distance less than that of the first distance.

6. The Schottky diode structure as claimed in claim 2, wherein the second electrode is separated from the second doped region by a third distance less than that of a length of the gate structure.

7. The Schottky diode structure as claimed in claim 6, wherein the first electrode is separated from the second electrode by a fourth distance greater than that of the first distance, the second distance, the third distance and the length of the gate structure.

8. The Schottky diode structure as claimed in claim 2, further comprising:
an isolation region disposed in the first well region, adjacent to the second doped region, wherein the first electrode and the second electrode are separated by the isolation region.

9. The Schottky diode structure as claimed in claim 8, wherein the first doped region is separated from the second doped region by the isolation region.

10. The Schottky diode structure as claimed in claim 8, wherein the gate structure partially covers the isolation region.

11. The Schottky diode structure as claimed in claim 8, wherein the first doped region and the second doped region are respectively adjacent to opposite sides of the isolation region.

12. A Schottky diode structure, comprising:
a semiconductor substrate having an active region;
a first well region having a first conductive type formed in the active region;
a first doped region having the first conductive type formed on the first well region;
a first electrode disposed on the active region, covering and contacting the first doped region;
a second electrode disposed on the active region, contacting to the first well region;
a gate structure comprising a gate insulating layer, a poly pattern disposed directly on top of the gate insulating layer and substantially aligning vertically therewith, and a plurality of spacers disposed on aligned sidewalls of both the gate insulating layer and the poly pattern, the gate structure being disposed on the first well region, wherein the second electrode, which is an anode of the Schottky diode, is separated from the gate structure; and
a second doped region, having a second conductive type opposite to the first conductive type, formed on the first well region, wherein the gate structure and the second doped region are disposed between the first and second electrodes.

13. The Schottky diode structure as claimed in claim 12, wherein the second doped region is disposed within a boundary of the gate structure.

14. The Schottky diode structure as claimed in claim 12, wherein the gate structure fully covers the second doped region.

15. The Schottky diode structure as claimed in claim 12, wherein the gate structure is adjacent to the second electrode.

16. The Schottky diode structure as claimed in claim 12, wherein the gate structure is electrically floating.

17. The Schottky diode structure as claimed in claim 12, wherein the gate structure is coupled to the second electrode.

18. The Schottky diode structure as claimed in claim 12, wherein the gate structure and the second doped region surround the second electrode.

19. The Schottky diode structure as claimed in claim 12, wherein the second electrode is separated from the poly pattern by the insulating spacers.

20. The Schottky diode structure as claimed in claim 12, wherein the second doped region is separated from the poly pattern by the gate insulating layer.

21. The Schottky diode structure as claimed in claim 12, wherein the first doped region is separated from the second doped region by a first distance.

22. The Schottky diode structure as claimed in claim 21, wherein the gate structure is separated from the first electrode by a second distance less than that of the first distance.

23. The Schottky diode structure as claimed in claim 12, wherein the second electrode is separated from the second doped region by a third distance less than that of a length of the gate structure.

24. The Schottky diode structure as claimed in claim 23, wherein the first electrode is separated from the second electrode by a fourth distance greater than that of the first distance, the second distance, the third distance and the length of the gate structure.

25. The Schottky diode structure as claimed in claim 12, wherein the first conductive type is n-type and the second conductive type is p-type.

26. The Schottky diode structure as claimed in claim 25, wherein the first electrode is a cathode.

27. The Schottky diode structure as claimed in claim 12, further comprising:
    an isolation region disposed in the first well region, having opposite sides respectively adjacent to the first doped region and the second doped region.

28. The Schottky diode structure as claimed in claim 27, wherein the first doped region is separated from the second doped region by the isolation region.

29. The Schottky diode structure as claimed in claim 27, wherein the gate structure partially covers the isolation region.

30. The Schottky diode structure as claimed in claim 27, wherein the first doped region and the second doped region are respectively adjacent to opposite sides of the isolation region.

\* \* \* \* \*